United States Patent [19]
Givens

[11] Patent Number: 5,908,813
[45] Date of Patent: Jun. 1, 1999

[54] METHOD MAKING INTEGRATED CIRCUIT METALLIZATION WITH SUPERCONDUCTOR BEOL WIRING

[75] Inventor: John H. Givens, Meridian, Id.

[73] Assignee: Micron Technology, Inc., Boise, Id.

[21] Appl. No.: 08/801,811

[22] Filed: Feb. 14, 1997

[51] Int. Cl.$^6$ .................................................. H01L 39/24
[52] U.S. Cl. .................. 505/473; 505/480; 505/500; 505/501; 505/220; 505/230; 427/62
[58] Field of Search ....................... 505/480, 473, 505/500, 501, 220, 230; 427/62, 63, 595

[56] References Cited

U.S. PATENT DOCUMENTS

| | | | |
|---|---|---|---|
| 4,965,248 | 10/1990 | Poppe et al. | 505/1 |
| 5,010,053 | 4/1991 | Maroni | 505/1 |
| 5,079,223 | 1/1992 | Maroni | 505/1 |
| 5,141,917 | 8/1992 | Tanaka et al. | 505/1 |
| 5,196,379 | 3/1993 | Weaver et al. | 505/1 |
| 5,200,389 | 4/1993 | Tachikawa et al. | 505/1 |
| 5,206,213 | 4/1993 | Cuomo et al. | 505/1 |

OTHER PUBLICATIONS

Nastasi et al, Appl. Phys. Lett. 52(20) May 1988, pp. 1729–1731.
Hubbard et al, J. Appl. Phys. 69(4) Feb. 1991, pp. 2397–2404.
Severin et al, Mat. Res. Bull., vol. 23, pp. 707–717, 1988.

*Primary Examiner*—Roy V. King
*Attorney, Agent, or Firm*—Workman, Nydegger & Seeley

[57] ABSTRACT

The present invention discloses an integrated circuit that is wired with a high-temperature superconductive material that is superconductive at temperatures of about 70° K and above, and methods of making the integrated circuit. The front-end manufactured semiconductor structure is patterned with a preferred precursor metal or metal oxide and a complementary compound is superposed and reacted to form wiring lines of superconductor ceramics that complete integrated circuits within the front-end manufactured semiconductor structure. The front-end manufactured semiconductor structure is alternatively patterned first with the complementary compound and the precursor metal is thinly patterned by ion implantation. The front-end manufactured semiconductor structure is then treated to form wiring lines of superconductor ceramics that complete integrated circuits within structure. The conductive lines, if formed within an oxidized portion of the complementary compound, are self-insulating by the presence of the oxided complementary compound. Operation of the devices is accomplished at "high" superconductive temperatures that cause improved solid state operation of the device, minimizing molecular vibrations and dislocation effects, and cause the wiring to be superconductive.

35 Claims, 3 Drawing Sheets

METHOD MAKING INTEGRATED CIRCUIT METALLIZATION WITH SUPERCONDUCTOR BEOL WIRING

BACKGROUND OF THE INVENTION

THE FIELD OF THE INVENTION

This invention relates to semiconductor devices upon a semiconductor substrate as they are electrically connected to each other to complete integrated circuits. More particularly, the invention relates to semiconductor devices upon a semiconductor substrate having electrical connections with the property of high-temperature (i.e. above about 70° K) superconductivity.

THE RELEVANT TECHNOLOGY

Semiconductor processing involves a number of different chemical and physical steps whereby minute electronic devices are created on a substrate at the front end of a fabrication process. Integrated circuits are constructed using multilayers of interrelated patterns of various materials, the layers being created by such processes as chemical vapor deposition (CVD), physical vapor deposition (PVD), and epitaxial growth. Some layers are patterned using photoresist masks and followed by wet and dry etching techniques.

Patterns are created within layers by the implantation of dopants at particular locations. The substrate upon which the devices are created may be silicon, gallium arsenide, glass, or other appropriate material.

In the production of integrated circuits upon semiconductor wafers, the back end of production involves connecting all the fabricated semiconductor devices on the chip with electrically conductive materials. This back-end-of-line (BEOL) "wiring" step, which is the electrical connection scheme for connecting semiconductor devices, completes the circuits as designed to function within the total integrated circuit device. Metal lines are used in the metallization process as electrical connections between semiconductor devices.

Several technical challenges arise for back-end wiring as more complex integrated circuitry is increasingly miniaturized upon semiconducting dies. One problem is Joule heat generation caused by resistive current flow through the metallization or wiring. A side-effect of heat generation due to resistive current flow is electromigration of certain preferred electrical conductors such as aluminum and copper. Electromigration is the diffuision of atoms in electric fields in the metal wiring that results in wire thining and ultimate breach and failure after it has been put into service. Such a phenomenon eventually opens the circuit by breaking the metal line and the device fails. A second heat problem is the side effect of device failure from overheating. Because heat is a product of the resistive-current flow process, a device with inadequate heat removal abilities causes the device to inadequately reject heat until resistivity increases to the point of device failure. The system can recover by shutting down and allowing the whole system to cool. Valuable time, however, is lost, a process controlled by the device runs without control, or information is lost.

Another problem is capacitance build-up between metallization lines that are separated by dielectrics. The need for ever-decreasing dielectric layer thicknesses makes capacitance build-up more likely as the distance between metal lines decreases. Undesired capacitance build-up creates unwanted electronic phenomena within the integrated circuit called cross-talk that causes marginal device function or device failure.

Yet another problem is the ever-decreasing metal line width requirement that makes metallization by photolithographic and sputtering techniques more difficult to achieve. As sub-tenths of micron line widths are being attempted, a technique for achieving thinner but continuous and adequately conductive metal lines is required.

The initial scientific breakthroughs in the superconductor art more than a decade ago were with 123 $YBaCuO_x$ compounds, but since their discovery, several higher-temperature superconductors have been developed such as $REBaCuO_x 2223$ BSCCO (Bismuth-Strontium-Calcium-Copper oxide), and Thallium-Bismuth-Lead copper oxides among others. Superconductors have the advantage of low resistance conduction of electricity.

It would be an advantage in the semiconductor art to use the low resistance of superconductors in the metallization process of semiconductor device fabrication.

SUMMARY OF THE INVENTION

The present invention addresses metallization of integrated circuit devices situated on a substrate assembly. The term substrate assembly is intended herein to mean a substrate having one or more layers or structures formed thereon. As such, the substrate assembly may be, by way of example and not by way of limitation, a doped silicon semiconductor substrate typical of a semiconductor device structure.

Metal lines are used as electrical connections between semiconductor devices. The electrical connections are made of high-temperature superconductor ceramic oxides. The metal lines are formed into an electrical connection or wiring scheme for connecting semiconductor devices with high-temperature superconductor ceramic oxides.

The inventive method of the present invention for metallizing a structure situated on a substrate assembly, in general, has a variety of embodiments. Initially, a structure is provided having an upper surface. The structure is situated on a substrate assembly. A compound is deposited upon the upper surface of the structure, and the compound is then implanted with metal ions of a metal material to form a metal line in a metal-compound composite. Alternatively, a metal layer can be formed into a metal line on the upper surface of the structure and a compound can then be deposited thereon. In either case, the materials of the metal and the compound are combined.

The metal line can be formed or patterned as having a two dimensional shape, and the material of the metal can be substantially composed of a material selected from a group consisting of copper, barium, yttrium, rare earth metals, thallium, strontium, gold, silver, bismuth, their equivalents, their oxides, or combinations thereof.

The metal and compound, when so combined, are treated at sufficient conditions to react the metal material and the compound so as to form a high-temperature superconductive ceramic oxide substantially composed of a superconductor film upon the upper surface of the structure, such as 1-2-3 $YBaCuO_x$ for example. The resultant high-temperature superconductive ceramic oxide will have the two dimensional shape of the metal layer or implanted metal ions.

The metal line and compound can be repeatedly layered, and the step of reacting the metal line and compound together to form the high-temperature superconductive ceramic oxide can be performed after the formation of each layer, or after the formation of all layers. It is preferable that the compound is the superconductor ceramic complement to the material of the metal line, and that the high-temperature superconductive ceramic oxide upon the upper surface of the structure be intermingled with excess metal material. The high-temperature superconductive ceramic oxide can be formed with the inventive method so as to have a width of less than 0.1 μm, and a thickness of less than 1000 Å.

BRIEF DESCRIPTION OF THE DRAWINGS

A more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Back-end-of-line (BEOL) superconductive semiconductor devices are described herein. BEOL superconductive semiconductor devices are created where the microelectronic structures manufactured at the front end of a manufacturing line, operate at a new level of solid-state efficiency. This new efficiency is due to operation of the semiconductor device structures in a "frozen out" state, and where BEOL wiring operates in the superconducting state. The semiconductor devices are designed to operate at the high temperature superconductor range that has been developed over the last decade or more. It is intended herein that the term high-temperature superconductive material be interpreted to mean a material that is superconductive at temperatures in a range from about 70° K to about 150° K and higher.

Two process options and their variations are available to fabricate this class of semiconductor devices. The first option is to deposit, pattern, and etch a seed layer of a preferred metal or metal oxide that will be covered with a complementary compound layer that, upon reacting, forms a superconducting phase. The inventive method of metallizing a structure situated on a substrate assembly is accomplished by a method that begins with providing a structure having an upper surface, the structure being situated on a substrate assembly. A metal layer is formed upon the upper surface of the structure and a compound is deposited upon the upper surface of the structure. The substrate assembly is then treated at sufficient conditions to react the metal layer and the compound so as to form a high-temperature superconductive ceramic oxide upon the upper surface of the structure. Depositing the compound may either precede or follow forming the metal layer, depending upon the specific application.

Deposition of the metal layer can be done by sputtering, evaporation, or wet chemistry such as electroplating or electrode-less plating. Patterning is done by conventional photolithography and etching processes.

Figure 1:
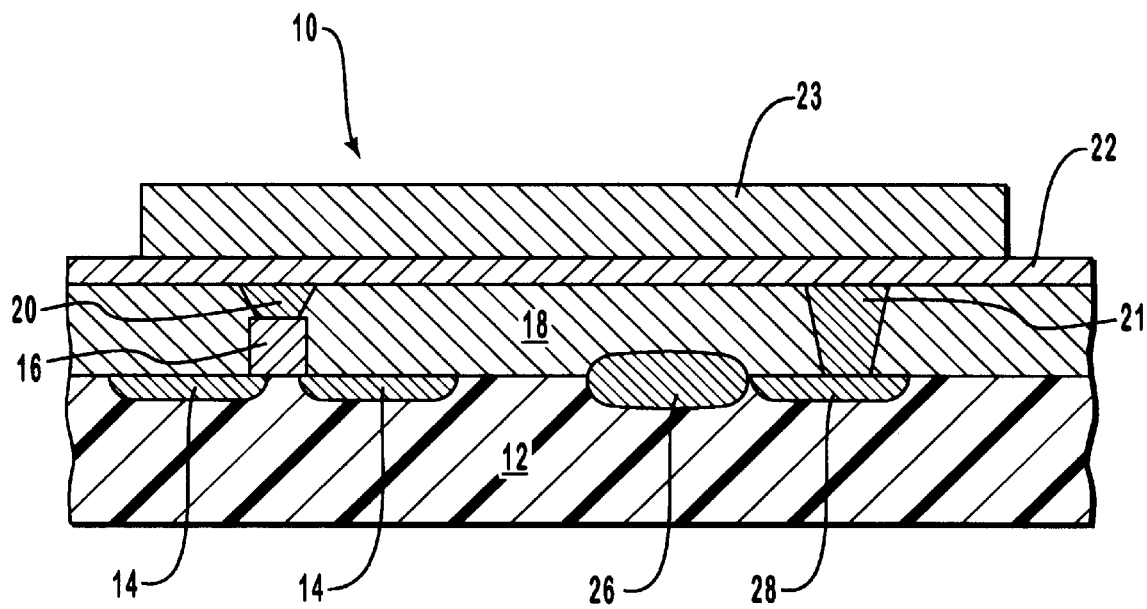
FIG. 1 is a cross sectional depiction of a semiconductor device with a layer of photoresist covering a copper or oxide layer that connects two metal-filled vias prior to an etch that exposes the copper or oxide layer.

FIG. 1 shows a structure 10 situated on silicon substrate assembly 12. By way of example, and not by way of limitation, silicon substrate assembly 12 can be a doped silicon semiconductor substrate typical of a semiconductor wafer. A field oxide region 26 and active areas 14, 28 are situated within silicon substrate assembly 12. A gate 16 and two (2) copper filled vias 20, 21 are within an oxide layer 18. A metal or oxide seed layer 22 can be deposited by PVD or CVD upon oxide layer 18 of structure 10. Depending upon the required wiring geometry, metal or oxide seed layer 22 can be blanket deposited, then patterned and etched using photoresist and etch media. Alternatively, metal or oxide seed layer 22 can be deposited over a patterned photoresist that is removed to leave a patterned metal or oxide seed layer 22 negative to the photoresist. In FIG. 1, metal or oxide seed layer 22 has been blanket deposited 23 and a photoresist has been superposed and patterned prior to a patterning etch that will leave a patterned metal or oxide layer 24 upon the oxide layer 18.

Figure 2:
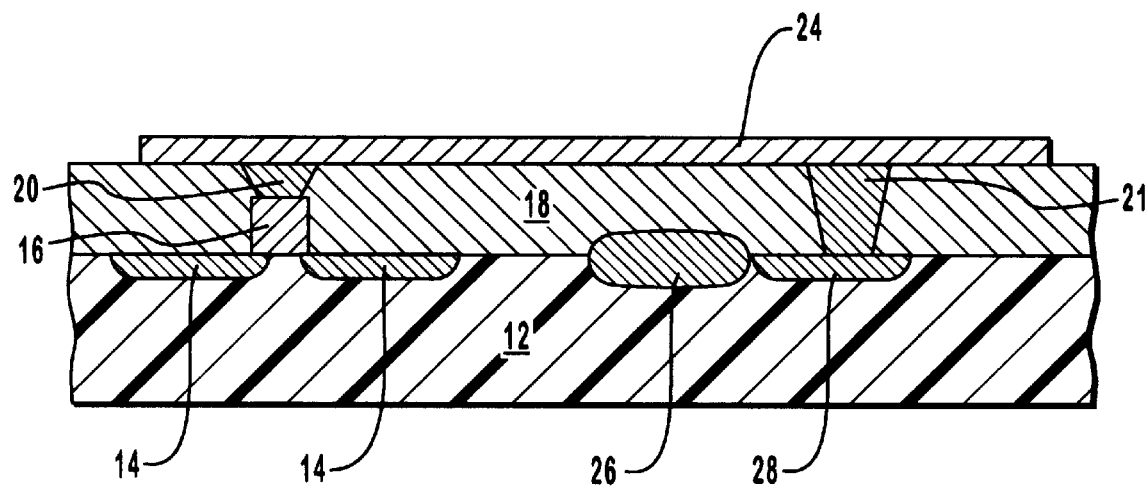
FIG. 2 is a cross sectional depiction of the semiconductor device seen in FIG. 1 where there is illustrated a completed semiconductor device having a superconducting connection between the two metal-filled vias, subsequent to the etch that exposes the copper or oxide layer.

Metal or oxide seed layer 22 is seen in FIG. 2 after it has been patterned to form patterned metal or oxide layer 24 seen in FIG. 2. A complementary compound is required to react with metal or oxide seed layer 22. As such, a layer of a complementary compound is superposed upon metal or oxide seed layer 22. Like metal or oxide seed layer 22, the layer of the complementary compound can be either blanket deposited or superposed over metal or oxide seed layer 22 through a photoresist. Both the blanket deposited and the superpositioning of the layer of the complementary compound are discussed below.

A superconducting phase is formed by reaction of metal or oxide seed layer 22 with the complementary compound of the materials making up metal or oxide seed layer 22. After the step of reacting the complementary compound with metal or oxide seed layer 22, there is left a self-insulated superconductor structure upon oxide layer 18, specifically when the complementary compound is blanket deposited. Where the reacted metal or oxide seed layer 22 does not lie under the blanket-deposited complementary compound, a dielectric blanket layer is formed.

Because of partial step coverage and the non-planar nature of the blanket-deposited complementary compound, some planarization may be required if the reacted metal or oxide seed layer 22 is not the final upper surface of the device and a topographically non-planar surface would be detrimental to the resultant structure after further layering. The non-planar nature of the blanket-deposited complementary compound leaves a topographically prominent "metallization" line of high temperature superconductive ceramic that can be planarized as are conventionally formed dielectrics such as oxides. Alternatively, the semiconductor structure may be sealed with a preferred ceramic or epoxy if BEOL wiring is complete. In the case of oxidation to planarize, where a subsequent structure is to be formed on top, the oxide growth is tightly controlled. This tight control avoids a subsequent planarization step because the superconductive ceramic compound is more brittle than conventional metallization, and planarization places an appreciable amount of fracture stress upon the structure. With the brittle ceramic circuit lines being the most prominent upper feature, planarization exposes these lines to brittle failure.

Another alternative for BEOL superconductive metal lines is to either blanket deposit a precursor compound followed by a patterned ion-implantation of a complementary metal(s) and reacting the precursor compound with the complementary ions to form superconducting metal lines. An alternative process for forming BEOL superconductive metal lines is to deposit and pattern a precursor compound, and then ion implant within the center lines of the pattern as above. Next, an optional oxidation or oxide deposition is performed in the metal line interstices so as to form a planarized structure upon the present upper face of the semiconductor structure, where superconducting metal lines are contained within the planarized structure.

The inventive method of metallizing a structure situated on a substrate assembly is carried out by a method that begins with providing a structure having an upper surface, the structure being situated on a substrate assembly. A metal layer is formed upon the upper surface of the structure and a compound is deposited upon the upper surface of the structure. The substrate assembly is then treated at sufficient conditions to react the metal layer and the compound so as to form a high-temperature superconductive ceramic oxide upon the upper surface of the structure. Depositing the compound may either precede or follow forming the metal layer, depending upon the specific application.

Figure 3:
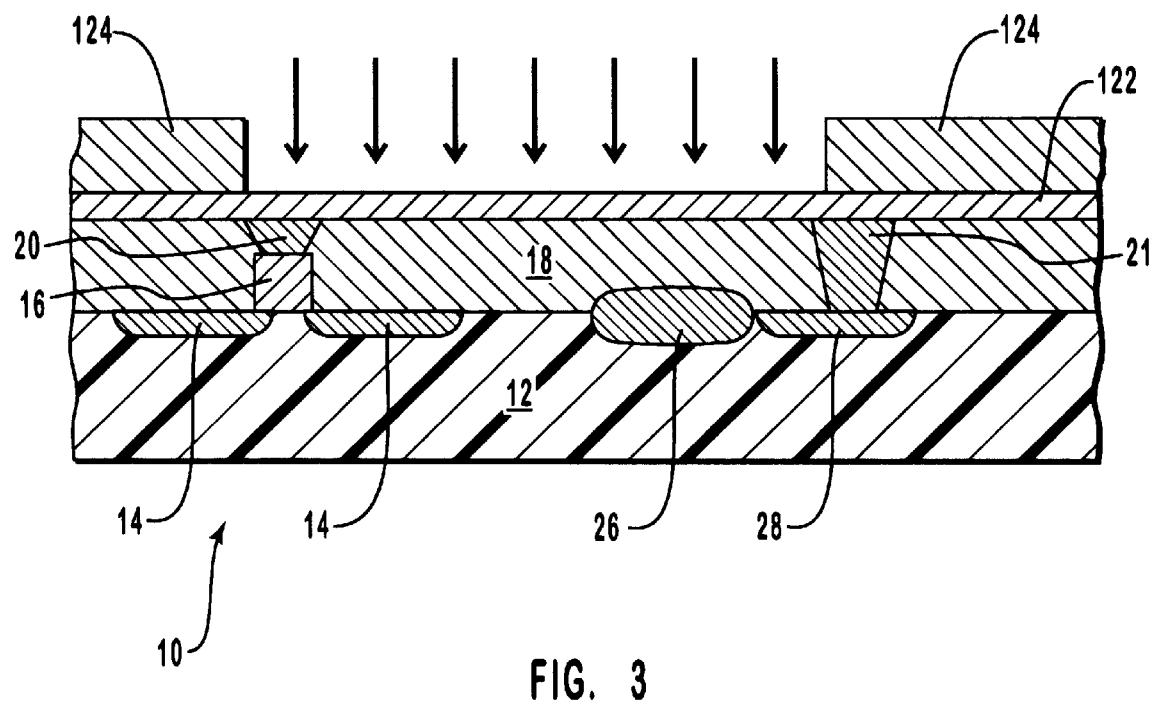
FIG. 3 is a cross sectional depiction of metal line created by implanting copper into an oxide layer so as to react the copper with the oxide layer and thereby form a complete superconductive metal line.

FIG. 3 illustrates a step in the preparation of a device 10 by ion implantation into a complementary compound field 122 that is patterned with a blocking mask 124.

A preferred embodiment of the inventive method incorporates the step of blanket depositing of the precursor compounds that will be combinable to form, for example, a 1-2-3 $YBaCuO_x$ superconductor. This is done by CVD depositing of a YBa film, implanting at least stoichiometric amounts of Cu ions in a patterned form, and reacting the YBa film and the Cu ions in the presence of oxygen to form 1-2-3 $YBaCuO_x$ patterned lines that are self-insulated with $YBaO_x$ interstices.

Because ion implantation can be focused below the quarter micron width (the present limit to photolithography patterning techniques), the advantage of ion implantation of metals into precursor compounds is that increasingly thinner metallization wiring can be accomplished that facilitates the relentless pressure to further miniaturize.

One quality of high-temperature superconductive metallization lines is that thinner wiring can be formed that can conduct as much current as wires of conventionally dimensioned wires, thus avoiding limitations known to conventional thin lines. As such, thin superconducting wiring serves the goal of miniaturization because it achieves the same and even higher current-flow duty capabilities as compared to conventional wiring.

The width of a superconducting wire is theoretically dependent, at the minimum, upon the ability to produce a continuous monomolecular superconducting ceramic wiring line. Presently, the inventive method can form a high-temperature superconductive ceramic oxide wire having a width of less than 0.1 μm, and a thickness of less than 1000 Å. The achieved wiring thickness is in a range from about 400 Å to 1000 Å. The width of superconducting wire is limited by the capabilities of photolithography equipment, and is in range greater than about 0.01 μm. Superconducting wire formed by the inventive method has advantages over the prior art. One advantage is that a whole order of magnitude for lateral-wiring miniaturization is accomplished by forming superconductive wiring lines below the sub-tenth micron metallization line width range. Another advantage is that the vertical profile of wiring layers is also significantly reduced.

Figure 4:
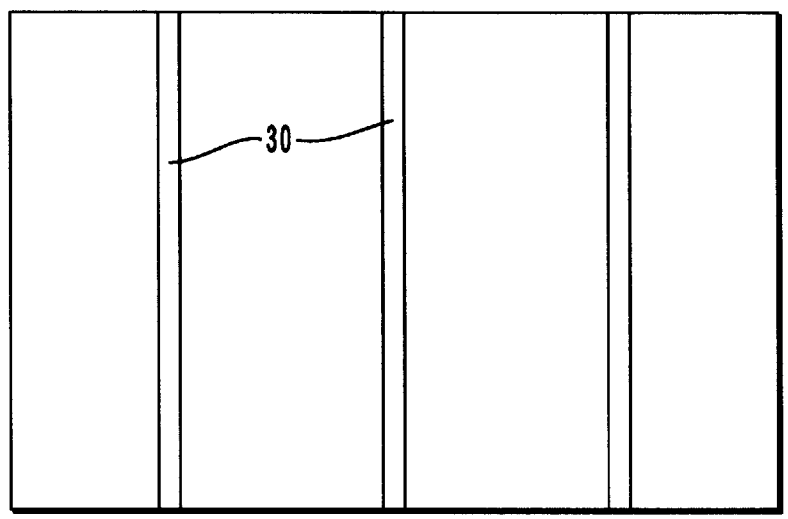
FIG. 4 shows a top planar view of precursor metallization lines superposed upon complementary compound oxides or metals prior to a reactive treatment step that leaves selfinsulated superconductor metallization lines.

FIG. 4 illustrates, for either the seed layer or the ion-implantation methods described above, a top planar view of precursor metallization lines 30 superposed upon complementary compound oxides or metals prior to a reactive treatment step that leaves self-insulated superconductor metallization lines. Metallization lines 30 will preferably be composed of copper or an oxide doped with copper.

In either the seed layer or the ion-implantation methods described above, it is sometimes useful to deposit or implant a stoichiometric excess of metal required to make the superconductive metal lines. The excess metal can be either the indigenous metal required to form the superconductor ceramic or can be a noble metal such as silver or gold that is implanted either simultaneously or serially to the required precursor compound. The effect of an excess of metal that stoichiometrically cannot react with the complementary compound is that a sheath, ribbon, or husk of metallization intermingles with the reacted, and now superconductive, components. This sheath, ribbon or husk of metallization imparts a ductile integrity to the device wiring. The ductile nature of the device wiring allows for further creation of superconductor material during the remainder of high-temperature processing as small amounts of precursor oxide will continue to react at the fringes of the metallization lines. This excess stoichiometric metal amount furthers the ductile quality of the superconducting wire. A benefit of the ductile quality of the superconducting wire is that the metal sheath, ribbon, or intermingled husk resists brittle fractures. Brittle fractures, can be induced by pressures in the process flow, such as CMP pressures upon a LOCOS or upon a deposited oxide layer.

The amount of metallization that is to be intermingled with the complimentary compound depends upon the specific application. For example, when excess metallization is desirable only to assure complete reaction of the complimentary compound in the region proximate the metallization, a slight stoichiometric excess is preferred. For example, a preferred amount of excess ion-implanted metallization is in a range from about 1.0 to about 2.0 stoichiometric. A more preferred amount is in a range from about 1.2 to about 1.8 stoichiometric. A most preferred amount is in a range from about 1.4 to about 1.6 stoichiometric. When excess metallization is preferred in order to impart a ductile integrity to the metallization line, up to ten times the require stoichiometric amount of metallization is preferred. A preferred amount of excess ion-implanted metallization for this application is in a range from about 1 to about 10 stoichiometric. A more preferred amount is in a range from about 3 to about 8 stoichiometric. A most preferred amount is in a range from about 5 to about 6 stoichiometric. Qualitatively, the preferred excess metal is silver although copper can be used as the primary precursor metal and then excess metal can be an addition of either copper or silver.

The step of treating the metal-compound composite at sufficient conditions to react the precursor compound with the metal to form a high-temperature superconductive ceramic ("reactive treatment step"), as set forth in either method above, can involve heating in oxidative or protective atmospheres and alternative pressing techniques. Where the last treatment for the semiconductor device is to be an anneal step, the anneal step can be postponed and performed simultaneously with the reactive treatment step. The reactive treatment step can be performed in an oxygen environment where there is a non-oxidized compound that is complementary to the metal. If, on the other hand, the postponed anneal is required in the presence of a protective atmosphere, a precursor oxide such as YBAaO, can be deposited and oxidation of the device will be localized only to the metal layer as it reacts to complete the circuit wiring as a superconductor ceramic.

The reactive treatment step will preferably be conducted at a temperature in a range from about 300° C. to about 1300° C. A more preferred temperature for the reactive treatment step is from about 300° C. to about 1100° C. A most preferred temperature for the reactive treatment step is from about 400° C. to about 900° C.

In some superconductor fabricating methods, a precompaction step must be performed in order to place the precursor elements or compounds in sufficient proximity to allow them to react. The precompaction step may be necessary since the superconductor formation process is a solid-to-solid reaction. Precompaction of superconductors is carried out by pressing, extruding, and rolling, among other methods. With a fabricated semiconductor device, only pressing, and preferably isostatic pressing, is feasible because rolling and extruding of the semiconductor device would destroy the structures that are the essence of the device. Isostatic pressing accomplishes an omni-directional pressure that places the device in an environment in which pressure gradients harmful to the microstructure of the device would not be experienced.

Isostatic pressing can be accomplished by covering the device with an impermeable photoresist "glove," placing the device in a pressure medium chamber, and applying an isostatic fluid pressure onto the device through the fluid medium. After pressing, the photoresist is removed by standard techniques such as stripping or global etching that does not attack the underlying structures. An option to etching off the glove or to removing the glove by stripping or etching is to burn off the glove in a heat treatment. In such a heat treatment, oxygen atoms are introduced which remove the photoresist compound and react with the underlying structure to create the superconductor oxide ceramics of the present invention. Due to the pressure, oxygen atoms more effectively contact the underlying precursor compound.

Isostatic pressing can also be accomplished by placing the device in an inert pressure medium that is large enough to avoid intermingling of the superconductive precursor materials, and then applying a quasi-isostatic pressure by pressing the device in a piston-type chamber. This type of pressure medium must be highly fluent, although it is a solid material. Hot isostatic pressing in an oxygen environment could also be utilized.

Pressure treatment is advantageously used more often with the first embodiment of the present invention (i.e., sputtering and patterning a metal seed line either before or after a complementary compound deposition thereon), where the two required layers are merely layered in contact one to another, as opposed to ion implantation in which the two required elements are intimately intermingled at the molecular scale.

Where a last anneal is required for the fabrication of the semiconductor device, the last anneal can be postponed until the reactive treatment step. The reactive treatment step can require both applied heat and pressure in order to accomplish formation of a superconductor ceramic. Where only heat is required, the preferred temperature conditions are set forth above. Where simultaneous pressure and heat, sequential pressure and heat, or sequential heat and pressure are required, care for the physical integrity of the semiconductor device become a processing factor. The reactive treatment step is preferably conducted at pressures in a range from about 100 KPa to about 120 MPa. A more preferred pressure for the reactive treatment step is in a range from about 2 MPa to about 100 MPa. A most preferred reactive treatment step is in a range from about 10 MPa to about 90 MPa.

Figure 5:
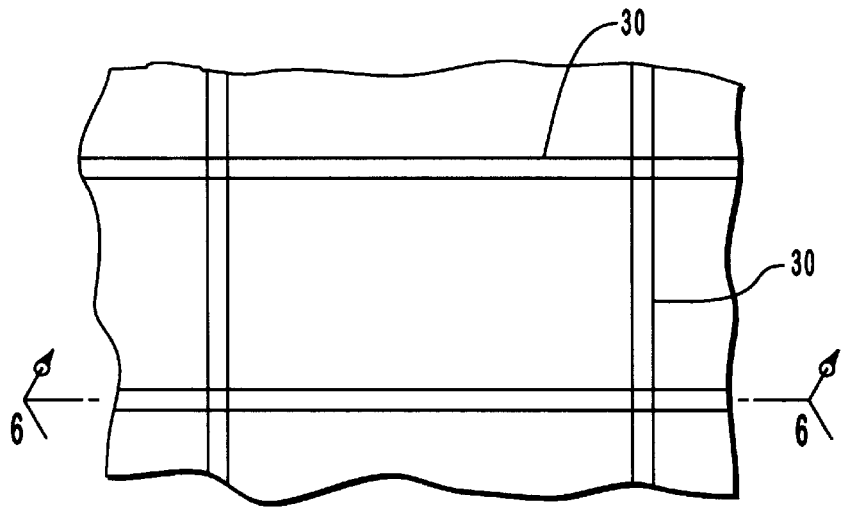
FIG. 5 shows a top planar view of the conventional criss-cross geometry of metal line wiring with dielectric layers therebetween.

Integrated circuit wiring is limited by dielectric interlayer thicknesses and the "pinch" of lateral wiring widths required to be placed upon a given surface. FIG. 5 illustrates a plan view of typical criss-cross wiring 30 of integrated circuits having insulative dielectric layers (not shown) between the lines of wiring 30. In contrast with the present invention, however, the dielectric layers are either ultra thin compared to a conventional dielectric layer for wiring 30, or a dielectric layer is not required with a superconducting metal line. Vias (not shown in FIG. 5) allow for interlevel contact where an electrical connection is required in the integrated circuit layout.

Figure 6:
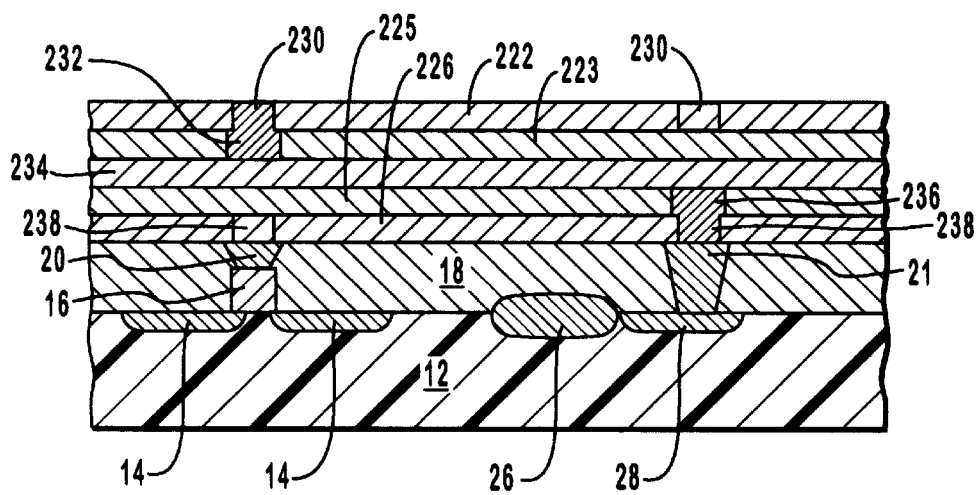
FIG. 6 shows a resultant structure using the present inventive method, where a cross-sectional view taken through the line 6—6 in FIG. 5 is depicted.

FIG. 6 is a cross-section of a line taken along section line 6—6 of FIG. 5, and shows a metallization line 230 imbedded in a dielectric 222, and a metallization line 238 imbedded in a dielectric 226. A metallization line 234 is imbedded in a dielectric that is not seen in FIG. 5. Alternatively and in accordance with the present invention, metallization line 230 can be imbedded in an unreacted compound 222, and metallization line 238 can be imbedded in an unreacted compound 226. Metallization line 234, in the alternative embodiment of the inventive method, is imbedded in an unreacted compound that is not seen in FIG. 6. Metallization lines 230, 234, 238, which are processed to be high-temperature superconductive ceramic oxide layers, run either perpendicular or parallel to page of FIG. 6. FIG. 6 depicts vias 232, 236 that are metal-filled and make interlevel connections, respectively, through dielectric layers 223 and 225.

In the present invention, the dielectric layer thicknesses can be made substantially thinner than conventional prior art dielectric layers because no capacitance phenomenon is encountered due to the superconductivity of the metallization lines. A dielectric thickness range from about 10 Å to about 5000 Å is preferred. A more preferred range is from about 100 Å to about 1000 Å. A most preferred thickness is about 500 Å.

Figure 7:
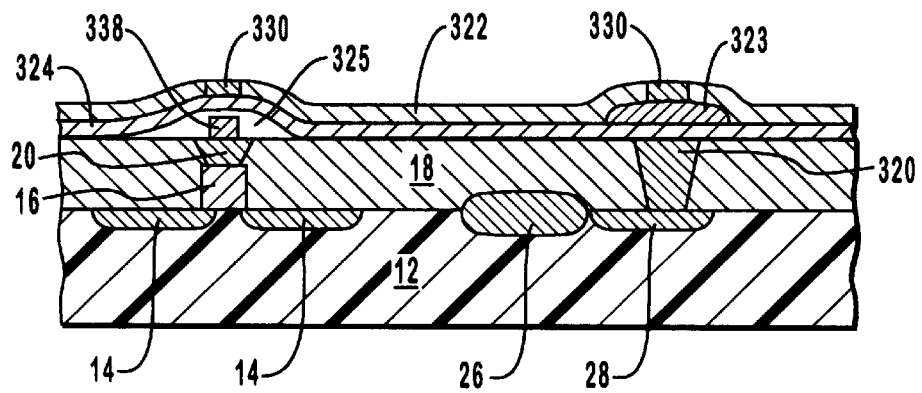
FIG. 7 shows a an alternative embodiment of the resultant structure seen in FIG. 6, where a cross-sectional view taken through the line 6—6 in FIG. 5 is depicted.

A benefit of thinner circuit lines is that a denser lateral wiring can be used. Additionally, vertical dielectric layers can be thinner, or the dielectric layers can be nonexistent depending upon the wiring layout. FIG. 7 illustrates a functionally similar wiring scheme as that of FIG. 6, but features minimal dielectric layers 323 and 325. Dielectric layers 323 and 325 can be minimized because the capacitance problem is eliminated by virtue of the superconductivity of the metallization lines. Superconductive metallization lines 330, 324, and 338 connect to other structures, including copper filled vias 20, 320. Layer 322 is composed of silicon dioxide by way of non-limiting example. The overall profile seen in FIG. 7 is lower than the overall profile of the equivalent wiring seen in FIG. 6 because dielectric layers 323 and 325 have been minimized.

In the present invention, a first circuit structure is formed by depositing a first seed layer and blanketing an optional oxide layer over the first seed layer. The first seed layer may optionally be patterned. Following the first step, a second seed layer is superposed over the first seed layer, but no shorting will occur. The absence of shorting is due to either sufficient lateral spacing because of thinner lines, or due to a minimized inter-level dielectric layer that is thinner than the prior art owing to the lack of capacitance build-up problems.

The circuits have thinner lines by ion implanting a thin patterned circuit into a complementary compound. The subsequent circuits are wired with thinner lines allowing for denser patterned wiring than previously achievable while, due to the superconductive nature of the wiring. Unwanted cross-talk interference is not encountered because capacitance build up between the lines is substantially eliminated.

The present invention provides a method of wiring integrated circuits on a substrate assembly with a high-temperature superconducting material to overcome the Joule-heating phenomenon. The electromigration phenomenon caused by prolonged Joule heating is substantially eliminated. The electromigration phenomenon is due to resistive current flow that results from electron crowding and metal ion diffusion because of resistance in the superconductive wiring. The unwanted capacitance phenomenon between metal lines is substantially eliminated, which phenomenon is due to induced charges caused by the potential differential between metal lines separated by ever-thinner dielectric layers. Where resistance drops to zero, the capacitance also drops to negligible levels even at the submicron scale. Using high-temperature superconductors wiring, there is substantially eliminated the possibility of unwanted capacitance in the wires, while the traditional capacitor materials retain their non-superconducting qualities at the temperatures required to achieve high-temperature superconducivity, thus not defeating the capacitance requirements of integrated circuit capacitors as they were designed to be used.

The inventive method achieves multiple-layer integrated circuit wiring that requires no intermediate planarization due to the extreme thinness of the superconducting wiring and dielectric layers. Enhanced solid state performance for a device fabricated with the inventive method is realized where the semiconductor device operates in the liquid nitrogen temperature range. In this temperature range, a side effect for device performance is that the entire device is "frozen out", meaning that molecular and interatomic vibrations are significantly lowered and the effects of dislocations are minimized. This "tighter" solid state device performs more efficiently and the superconductive wiring further enhances device performance.

The present invention produces thinner wiring lines of superconductive material that cannot be achieved under the previous state of the art with photolithographic and sputtering techniques. Patterned ion-implantation of preferred metals into preferred dielectric oxide compounds that are stoichiometrically complementary to the preferred metals, and reaction of the preferred metals with the preferred complementary compounds, only in the ion-implanted pattern, creates self-insulated high-temperature superconductor wiring within unreacted oxide. Ion-implanted pattern line widths can be significantly thinner than photolithographic sputtered line widths by reason of sub-tenth micron ion beam width capabilities.

Where one mode of carrying out the invention is to employ an oxide that is not the metal-less complement of a superconductor, a conventional field oxide can be etched to remove wiring channels and the metal-less complement of a preferred superconductor compound can be filled into the wiring channels. After planarization of the metal-less complement of a preferred superconductor compound, a line of ion-implanted metal that complements the metal-less compound is implanted in a width that is significantly thinner than the filled wiring channel. The whole structure is then subjected to a reactive treatment to react the metal and the metal-less compound to form the preferred superconductor.

The present invention produces superconductive wiring layers that are separated by no dielectric layers, or by thinner dielectric layers than the previously achieved state of the art, while retaining proper anti-shorting qualities. By achievement of thinner or nonexistent layers, the device is able to be even thinner than the previous state of the art. This facilitates continued miniaturization, and eliminates unwanted capacitance build up in the wiring.

The present invention produces self-insulating electrical connections for completed integrated circuits. Where a complementary superconductor compound can only react with the required metal if it is present (by ion implantation or otherwise), the electrical connections will be self insulating due to the unreacted and unconverted oxide compound is that surrounds the converted superconducting metal lines.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method of metallizing a structure situated on a substrate assembly comprising:

providing a structure having an upper surface, the structure being situated on a substrate assembly;

forming a first layer upon the upper surface of the structure;

depositing a compound upon the upper surface of the structure either said first layer or said compound being a metal; and treating the substrate assembly at sufficient conditions to react the first layer and the compound so as to form a high-temperature superconductive ceramic oxide that is superconductive at temperatures of about 150° K and below.

2. A method according to claim 1, wherein the high-temperature superconductive ceramic oxide is substantially composed of a yttrium barium copper oxide superconductor film.

3. A method according to claim 2, wherein the first layer has a stoichiometric excess in the range of about 1 to about 10.

4. A method according to claim 1, further comprising patterning the first layer into a two dimensional shape, and wherein the high-temperature superconductive ceramic oxide has the two dimensional shape of the first layer.

5. A method according to claim 1, wherein the first layer is substantially composed of a metal oxide.

6. A method according to claim 1, wherein the high-temperature superconductive ceramic oxide has a width of less than 0.1 $\mu$m, and a thickness of less than 1000 Å.

7. A method according to claim 1, further comprising pressing the first layer and the compound together at a pressure in a range from about 10 MPa to about 90 MPa, and at temperature in a range from about 400° C. to about 900° C.

8. A method according to claim 1, wherein depositing a compound over the upper surface of the structure precedes forming a first layer upon the upper surface of the structure.

9. A method according to claim 1, further comprising: making multiple layers, said making multiple layers comprising repeating providing a structure having an upper surface, forming a first layer, depositing a compound, and treating the substrate assembly, each of said multiple layers having a high-temperature superconductive ceramic oxide that is superconductive at temperatures of about 150° K and below.

10. A method according to claim 9, wherein the first layer of one of the multiple layers is composed of a different material than the first layer of another of the multiple layers, and wherein the compound of one of the multiple layers is composed of a different material than the compound of another of the multiple layers, whereby a high-temperature superconductive ceramic oxide that is superconductive at temperatures of about 150° K and below is formed on one of the multiple layers that is different than a high-temperature superconductive ceramic oxide that is superconductive at temperatures of about 150° K and below that is formed on another one of the multiple layers.

11. A method according to claim 1, further comprising: making multiple layers, said making multiple layers being prior to treating the substrate assembly and comprising repeating providing a structure having an upper surface, forming a first layer, and depositing a compound, each of said multiple layers having a first layer-compound composite, and wherein treating the substrate assembly further comprises treating the substrate assembly at sufficient conditions to react the first layer and the compound so as to form a high-temperature superconductive ceramic oxide that is superconductive at temperatures of about 150° K and below for each of said multiple layers.

12. A method according to claim 11, wherein the first layer of one of the multiple layers is composed of a different material than the first layer of another of the multiple layers, and wherein the compound of one of the multiple layers is composed of a different material than the compound of another of the multiple layers, whereby a superconductive ceramic oxide is formed on one of the multiple layers that is different than a superconductive ceramic oxide that is formed on another one of the multiple layers.

13. A method according to claim 1, wherein the first layer is substantially composed of a material selected from copper, barium, yttrium, rare earth metals, thallium, strontium, gold, silver, bismuth, their oxides, or combinations thereof.

14. A method according to claim 13, where the compound is a compound complementary to the first layer, and wherein the high-temperature superconductive ceramic oxide is intermingled with excess metal the excess metal being in a range from about 1 to about 3 stoichiometric.

15. A method according to claim 1, further comprising: pressing the first layer and the compound together at a pressure in a range from about 2 MPa to about 100 MPa.

16. A method of metallizing a structure situated on a substrate assembly comprising:
providing a structure having an upper surface, the structure being situated on a substrate assembly;
depositing a compound upon the upper surface of the structure;
ion implanting the compound with a metal material to form a metal line in a metal-compound composite;
treating the metal-compound composite at sufficient conditions to react the metal material and the compound so as to form a high-temperature superconductive ceramic oxide that is superconductive at temperatures of about 150° K and below; and
making multiple layers, said making multiple layers comprising repeating providing a structure having an upper surface, depositing a compound, ion implanting the compound, and treating the metal-compound, each of said multiple layers having a high-temperature superconductive ceramic oxide that is superconductive at temperatures of about 150° K and below.

17. A method according to claim 16, wherein the metal layer of one of the multiple layers is composed of a different metal material than the metal layer of another of the multiple layers, and wherein the compound of one of the multiple layers is composed of a different material than the compound of another of the multiple layers, whereby a high-temperature superconductive ceramic oxide that is superconductive at temperatures of about 70° K and above is formed on one of the multiple layers that is different than a high-temperature superconductive ceramic oxide that is superconductive at temperatures of about 70° K and above that is formed on another one of the multiple layers.

18. A method of metallizing a structure situated on a substrate assembly comprising:
providing a structure having an upper surface, the structure being situated on a substrate assembly;
forming a first layer upon the upper surface of the structure, said first layer being substantially composed of a material selected from copper, barium, yttrium, rare earth metals, thallium, strontium, gold, silver, bismuth, or an oxide thereof;
patterning the first layer into a two dimensional shape
depositing a compound upon the upper surface of the structure, either said first layer or said compound being a metal; and
treating the substrate assembly at sufficient conditions to react the first layer and the compound so as to form a high-temperature superconductive ceramic oxide that is superconductive at temperatures of about 150° K and below upon the upper surface of the structure substantially composed of yttrium barium copper oxide superconductor film having the two dimensional shape of the first layer.

19. A method according to claim 18, wherein the first layer has a stoichiometric excess in the range of about 1 to about 10.

20. A method according to claim 18, wherein the first layer is substantially composed of a metal oxide.

21. A method according to claim 17 wherein the high-temperature superconductive ceramic oxide has a width of less than 0.1 μm, and a thickness of less than 1000 Å.

22. A method according to claim 18, further comprising: pressing the first layer and the compound together at a pressure in a range from about 10 MPa to about 90 MPa, and at temperature in a range from about 400° C. to about 900° C.

23. A method according to claim 18, wherein depositing a compound over the upper surface of the structure precedes forming a first layer upon the upper surface of the structure.

24. A method according to claim 18, further comprising:
  making multiple layers, said making multiple layers comprising repeating providing a structure having an upper surface, forming a first layer, patterning the first layer, and depositing a compound, each of said multiple layers having a high-temperature superconductive ceramic oxide that is superconductive at temperatures of about 150° K and below.

25. A method according to claim 24, wherein the first layer of one of the multiple layers is composed of a different material than the first layer of another of the multiple layers, and wherein the compound of one of the multiple layers is composed of a different material than the compound of another of the multiple layers, whereby a high-temperature superconductive ceramic oxide that is superconductive at temperatures of about 150° K and below is formed on one of the multiple layers that is different than a high-temperature superconductive ceramic oxide that is superconductive at temperatures of about 150° K and below that is formed on another of the multiple layers.

26. A method according to claim 18, further comprising:
  making multiple layers, said making multiple layers being prior to treating the substrate assembly and comprising repeating providing a structure having an upper surface, forming a first layer, patterning the first layer, and depositing a compound, each of said multiple layers having a metal-compound composite, and wherein treating the substrate assembly further comprises:
  treating the substrate assembly at sufficient conditions to react the first layer and the compound so as to form a high-temperature superconductive ceramic oxide that is superconductive at temperatures of about 150° K and below upon the upper surface of the structure for each of said multiple layers.

27. A method according to claim 26, wherein the first layer of one of the multiple layers is composed of a different material than the first layer of another of the multiple layers, and wherein the compound of one of the multiple layers is composed of a different material than the compound of another of the multiple layers, whereby a superconductive ceramic oxide is formed on one of the multiple layers that is different than a superconductive ceramic oxide that is formed on another of the multiple layers.

28. A method according to claim 18, where the compound is a compound complementary to the first layer, and wherein the high-temperature superconductive ceramic oxide upon the upper surface of the structure is intermingled with excess metal material of the first layer, the excess metal being in a range from about 1 to about 3 stoichiometric.

29. A method according to claim 18, further comprising:
  pressing the first layer and the compound together at a pressure in a range from about 2 MPa to about 100 MPa.

30. A method of metallizing a structure situated on a substrate assembly comprising:
  providing a structure having an upper surface, the structure being situated on a substrate assembly;
  depositing a compound upon the upper surface of the structure;
  implanting the compound with metal ions of a metal material to form a metal line in a metal-compound composite, the metal line having a two dimensional shape, and the metal material being substantially composed of a material selected from copper, barium, yttrium, rare earth metals, thallium, strontium, gold, silver, bismuth, or combinations thereof;
  treating the metal-compound composite at sufficient conditions to react the metal material and the compound so as to form a high-temperature superconductive ceramic oxide that is superconductive at temperatures of about 150° K and below substantially composed of yttrium barium copper oxide superconductor film, the high-temperature superconductive ceramic oxide having the two dimensional shape of the metal line; and
  making multiple layers and comprising repeating providing a structure depositing a compound, implanting the compound, and treating the metal compound composite, each of said multiple layers having a high-temperature superconductive ceramic oxide that is superconductive at temperatures of about 150° K and below.

31. A method according to claim 30, wherein the metal layer of one of the multiple layers is composed of a different metal material than the metal layer of another of the multiple layers, and wherein the compound of one of the multiple layers is composed of a different material than the compound of another of the multiple layers, whereby a high-temperature superconductive ceramic oxide that is superconductive at temperatures of about 70° K and above is formed on one of the multiple layers that is different than a high-temperature superconductive ceramic oxide that is superconductive at temperatures of about 70° K and above that is formed on another one of the multiple layers.

32. A method of metallizing a structure situated on a substrate assembly comprising:
  providing a structure having an upper surface, the structure being situated on a substrate assembly;
  depositing a compound upon the upper surface of the structure;
  ion implanting the compound with a metal material to form a metal line in a metal-compound composite;
  treating the metal-compound composite at sufficient conditions to react the metal material and the compound so as to form a high-temperature superconductive ceramic oxide that is superconductive at temperatures of about 150° K and below; and
  making multiple layers, said making multiple layers being prior to treating the substrate assembly and comprising repeating providing said structure having an upper surface, depositing a compound, ion implanting the compound, and treating the metal-compound, each of said multiple layers having a high-temperature superconductive ceramic oxide that is superconductive at temperatures of about 150° K and below.

33. A method according to claim 32, wherein the metal layer of one of the multiple layers is composed of a different metal material than the metal layer of another of the multiple layers, and wherein the compound of one of the multiple layers is composed of a different material than the compound of another of the multiple layers, whereby a superconductive ceramic oxide is formed on one of the multiple layers that is different than a superconductive ceramic oxide that is formed on another one of the multiple layers.

34. A method of metallizing a structure situated on a substrate assembly comprising:
  providing a structure having an upper surface, the structure being situated on a substrate assembly;
  depositing a compound upon the upper surface of the structure;
  implanting the compound with metal ions of a metal material to form a metal line in a metal-compound composite, the metal line having a two dimensional shape, and the metal material being substantially composed of a material selected from copper, barium, yttrium, rare earth metals, thallium, strontium, gold, silver, bismuth, or combinations thereof;

treating the metal-compound composite at sufficient conditions to react the metal material and the compound so as to form a high-temperature superconductive ceramic oxide that is superconductive at temperatures of about 150° K and below substantially composed of yttrium barium copper oxide superconductor film, the high-temperature superconductive ceramic oxide having the two dimensional shape of the metal line; and making multiple layers, said making multiple layers being prior to treating the metal-compound composite and comprising repeating providing a structure having an upper surface, depositing a compound, and implanting the compound, wherein treating the metal-compound composite further comprises treating the substrate assembly at sufficient conditions to react the metal layer and the compound so as to form a high-temperature superconductive ceramic oxide that is superconductive at temperatures of about 150° K and below for each of said multiple layers, and wherein the metal layer of one of the multiple layers is composed of a different metal material than the metal layer of another of the multiple layers.

35. A method according to claim 34, wherein the metal layer of one of the multiple layers is composed of a different metal material than the metal layer of another of the multiple layers, and wherein the compound of one of the multiple layers is composed of a different material than the compound of another of the multiple layers, whereby a superconductive ceramic oxide is formed on one of the multiple layers that is different than a superconductive ceramic oxide that is formed on another one of the multiple layers.

* * * * *

UNITED STATES PATENT AND TRADEMARK OFFICE
CERTIFICATE OF CORRECTION

PATENT NO. : 5,908,813
DATED : Jun. 1, 1999
INVENTOR(S) : John H. Givens

It is certified that error appears in the above-identified patent and that said Letters Patent is hereby corrected as shown below:

Col. 1, line 48, after "wire" change "thining" to --thinning--

Col. 2, line 11, change "REBaCuO$_x$2223" to --REBaCuO$_x$, 2223--

Col. 3, line 33, after "leaves" change "selfin-" to --self-in--

Col. 3, line 42, after "shows" delete "a"

Col. 6, line 56, after "times the" change "require" to --required--

Col. 7, line 11, after "such as" change "YBAaO" to --YbaOx--

Col. 8, line 10, after "device" change "become" to --becomes--

Col. 9, line 15, after "of the" change "wiring. Unwanted" to --wiring, unwanted--

Col. 10, line 25, before "that" delete "is"

Signed and Sealed this

Second Day of May, 2000

*Attest:*

Q. TODD DICKINSON

*Attesting Officer*      *Director of Patents and Trademarks*